US 6,718,499 B1

(12) United States Patent
Zuras, Jr.

(10) Patent No.: US 6,718,499 B1
(45) Date of Patent: Apr. 6, 2004

(54) MACE CODE (75) Inventor: George D. Zuras, Jr., San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/360,363

(22) Filed: Jul. 23, 1999

(51) Int. Cl.$^7$ .................. G08C 25/00; H03M 13/00
(52) U.S. Cl. ............................................. 714/746
(58) Field of Search ..................... 714/746, 758, 714/757, 752, 777, 800, 805, 807, 763, 764, 766, 767, 701, 702

(56) References Cited

U.S. PATENT DOCUMENTS

| | | | |
|---|---|---|---|
| 3,755,779 A | | 8/1973 | Price .................. 340/146.1 AL |
| 4,335,459 A | * | 6/1982 | Miller |
| 4,345,328 A | * | 8/1982 | White |
| 4,692,922 A | * | 9/1987 | Kiriu et al. |
| 5,463,643 A | * | 10/1995 | Gaskins et al. |
| 5,539,754 A | | 7/1996 | Zuras, Jr. et al. .......... 371/37.1 |

* cited by examiner

*Primary Examiner*—Christine T. Tu (57) ABSTRACT

A cyclic SEC-DED-PEC code is provided and circuitry therefor which has the characteristics of two different distance codes. When w[i] and w[j] are two different code words in the code, then distance(w[i],w[j])≧4 for all i≠j and, when w[i] and w[j] differ in both of an adjacent pair of bits, then distance(w[i],w[j])≧6 where distance(w1,w2) is the ordinary Hamming distance. When the code is permuted by a cyclic permutation, the same code results. The code may be thought of in hyperspace as a hypersphere of a certain distance having spikes extending from the center of the hypersphere to the tip of the spike a further distance. This presents a "hyper-mace", thus the name "Mace Code", having the property that it is a certain distance code generally and a further distance code in the direction of the spikes. The circuitry further provides for a code that is only slightly more complex than an ordinary distance-4 code but which can correct more errors that are likely to occur.

20 Claims, 6 Drawing Sheets

MACE CODE

TECHNICAL FIELD

The present invention relates generally to error-correcting codes and more particularly to a single bit error correcting, double bit error detecting, pair error correcting code.

BACKGROUND ART

In data communication systems, it is often desirable and necessary to ensure the integrity of the data being transferred. To accomplish this, various error correction and detection circuits in code have been developed. Error correcting codes (ECCs) are used to maintain data integrity in the presence of unreliable hardware or noisy data transmission environments.

These codes fall into a number of "distance" categories. The distances are measured in a higher dimensional space where a code is viewed as a packing of hyperspheres with the code word at the center of a sphere having a specified distance from the code word at the center of the next sphere. For example, a distance-4 code has the code word at the center of a sphere having a radius of 2 and no other code word closer than 4. These categories are:

A distance-2 code (also known as parity code) can detect any single bit error but cannot correct it. This is commonly used where errors are thought to be rare but cannot be tolerated.

A distance-3 code (also known as a single error correcting (SEC) or Hamming code) can correct any single bit error but will mis-correct double bit errors. This is not commonly used because of the "silent data corruption" of double bit errors.

A distance-4 code (also known as a single error correcting, double error detecting (SEC-DED code) can correct any single bit error and detect any double bit error. This is the most commonly used error code today.

A distance-5 or a distance-6 code (also known as double error correcting (DEC) code) can correct double bit errors. This is not commonly done because the circuitry that is required for such codes is large, slow, expensive, and complex.

The ordinary distance-4 codes fail to correct for double bit errors. The distance-5 or greater codes can correct double bit errors but are realized in circuitry that is generally very complex relative to distance-4 codes.

Some codes (also known as pair error correcting (PEC) code) can correct errors in adjacent bit pairs by the overlap of two codes, but require many code bits for a given size of data word protected.

While random double bit errors are not common in most current applications, part failures are common enough to warrant a method of protecting the data from them. A code has long been sought which would more efficiently (1) correct all single bit errors; (2) correct specified pairs of double bit errors; and (3) detect all other double bit errors.

DISCLOSURE OF THE INVENTION

The present invention provides a cyclic SEC-DED-PEC code which has the characteristics of two different distance codes. The code of the present invention may be thought of in hyperspace as a hypersphere of a certain distance having spikes extending from the center of the hypersphere to the tip of the spike a further distance. This presents a "hypermace", thus the name "Mace Code", having the property that it is a certain distance code generally and a further distance code in the direction of the spikes. The code further has the property that, if the description of the code is permutated by a cyclic permutation, the same code is obtained. To describe the Mace Code, the same notation as used in the George D. Zuras and Alexander J. Neudeck patent (U.S. Pat. No. 5,539,754) is used herein.

The present invention further provides circuitry for a code that is only slightly more complex than an ordinary distance-4 code but which can correct more of the errors that are likely to occur.

The present invention further provides a system that can correct single errors and adjacent pair errors, but requires far fewer code bits for a given size of data word protected than conventional PEC systems.

The above and additional advantages of the present invention will become apparent to those skilled in the art from a reading of the following detailed description when taken in conjunction with the accompanying drawings.

BEST MODE FOR CARRYING OUT THE INVENTION

The best mode for carrying out the error correcting code of the present invention is in a Mace Code where 180 data bits are protected by 12 code bits, thus a 12-bit Mace Code, for a total code width of 180+12=192 bits. The total code width may be determined by the computer solution of an equation provided herein. The first 12-bit Mace Code is denoted by the notation 001:01c, 023:0bc, 037:92a, 08937f, 0d3:ace, 12b:cbf, 16f:fae, 17d:9a7. This notation is described in the Zuras et al. U.S. Pat. No. 5,539,754, supra. The cyclic error correcting code circuitry for the 12-bit Mace Code is built up of a plurality of circularly-arranged simpler circuits as would be obvious to those skilled in the art from the description of the circularly-arranged simpler 6-bit Mace Code circuitry hereinafter described.

Figure 1:
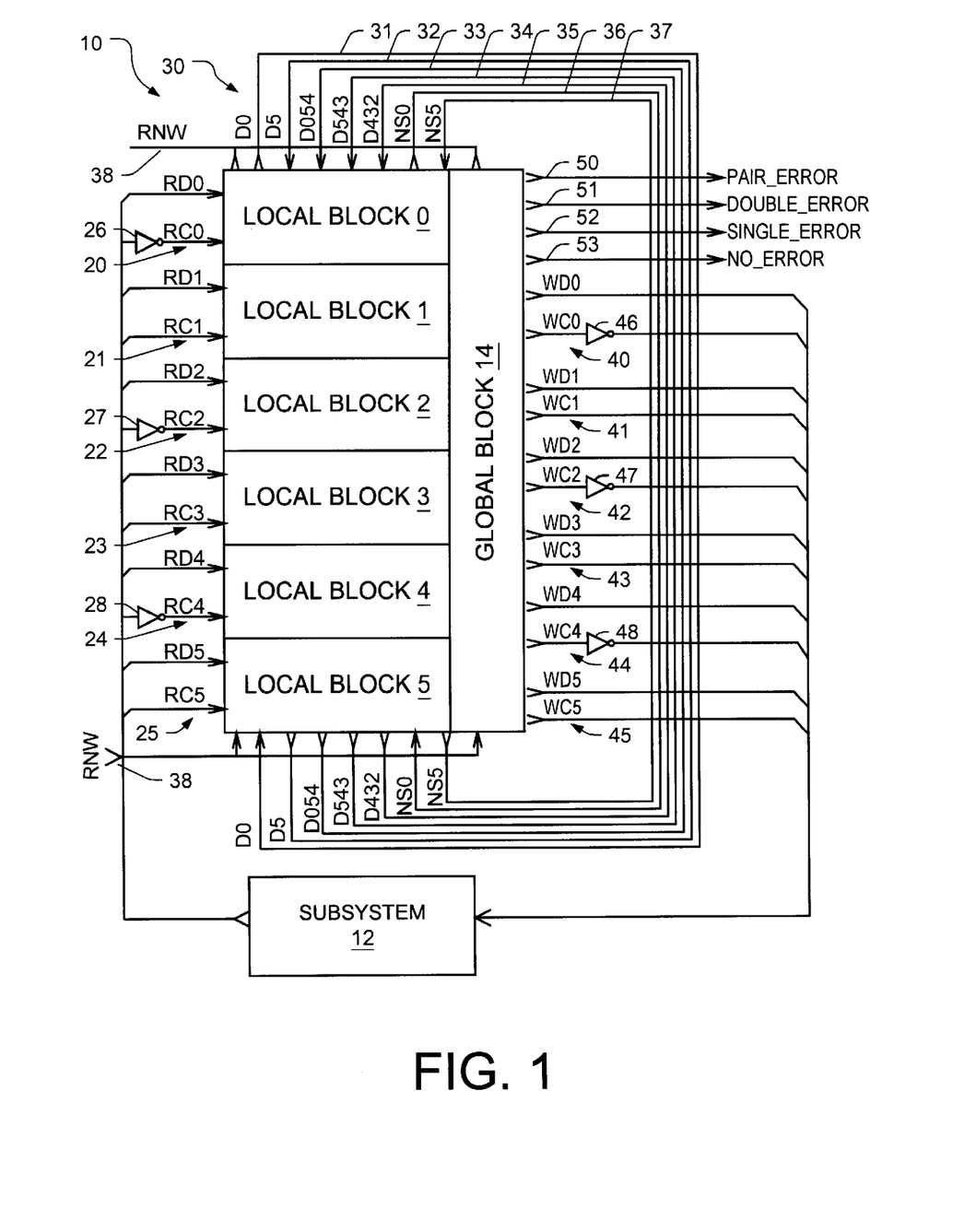
FIG. 1 is a cyclic error correcting code system that error corrects a basic 6-bit Mace Code.

Referring now to FIG. 1, therein is shown a cyclic error correcting code (ECC) system 10 that uses a 6-bit Mace Code which is output as a bit stream containing possible errors from a subsystem 12. The subsystem 12 represents an element such as a computer central processing unit, memory, communication channels, wires, and other code producing, utilizing, carrying, or receiving elements. It could further represent separate systems for sending and receiving code.

The first code for the 6-bit Mace Code is denoted by the hexadecimal notation 01:1c. The code is organized so there are six data bits protected by six code bits for a total of twelve bits for the code word so it is considered a 6+6=12 code.

The 6-bit Mace Code error-correcting circuitry is organized for each of the six bits as six circularly-arranged identical blocks, designated as local blocks 0 through 5. Each local block accepts two bits through its connection to the subsystem 12. For example, the local block 0 accepts data bit 0 and code bit 0 at read data (RD) bit 0, designated RD0, and read code (RC) bit 0, designated RC0, respectively, pair of inputs 20. Similarly, the blocks 1–5 accept data and code bits at RD1–5 and RC1–5 pairs of inputs 21–25.

Inverters such as inverters 26, 27, and 28 may be respectively interposed on the connections such as those to RC0, RC2, and RC4 inputs 20, 22, and 24 to avoid problems with bit strings of all zeroes or ones, or a temporary failure of circuitry connected to the subsystem 12.

The local blocks 0–5 are circularly interconnected to each other, i.e., local block 1 is connected to local block 0, local block 0 is connected to local block 5, local block 5 is connected to local block 4, etc. Thus, they have a plurality of inputs and outputs to and from adjacent blocks. In FIG. 1, inputs/outputs 30 between local block 0 and 5 are shown. The inputs/outputs 30 consist of connections 31–37 respectively for data bit 0 (D0), D5, D054, D543, D432, intermediate bit 0 (NS0), and NS5. Read not write (RNW) input 38 is a global control. Similar connections (not shown) are among all the blocks 0–5.

The local blocks 0–5 are further connected to a global block 14. The global block 14 outputs the corrected pairs of bits at paired outputs 40–45 back to the subsystem 12. For example, the global block 14 outputs data bit 0 and code bit 0 at write data (WD) bit 0, designated as WD0, and write code (WC) bit 0, designated as WC0, respectively, pair of outputs 40. Similarly, the global block 14 outputs error corrected data and code bits at WD and WC 1–5 pairs of outputs 41–45.

Inverters such as inverters 46, 47, and 48 may be respectively interposed on the connections such as those from WC0, WC2, and WC2 inputs 40, 42, and 44 to invert the signal inversions by inverters 26, 27, and 28, respectively to the subsystem 12. It should be noted that the inverters 46 and 26, 47 and 27, and 48 and 28 must be used in these corresponding pairs; i.e., if an inverter is used on an input to a local block, an inverter is used on the corresponding output from the global block.

The global block 14 further has status outputs such as a pair error output 50, a double error output 51, a single error output 52, and a no error output 53.

Figure 2:
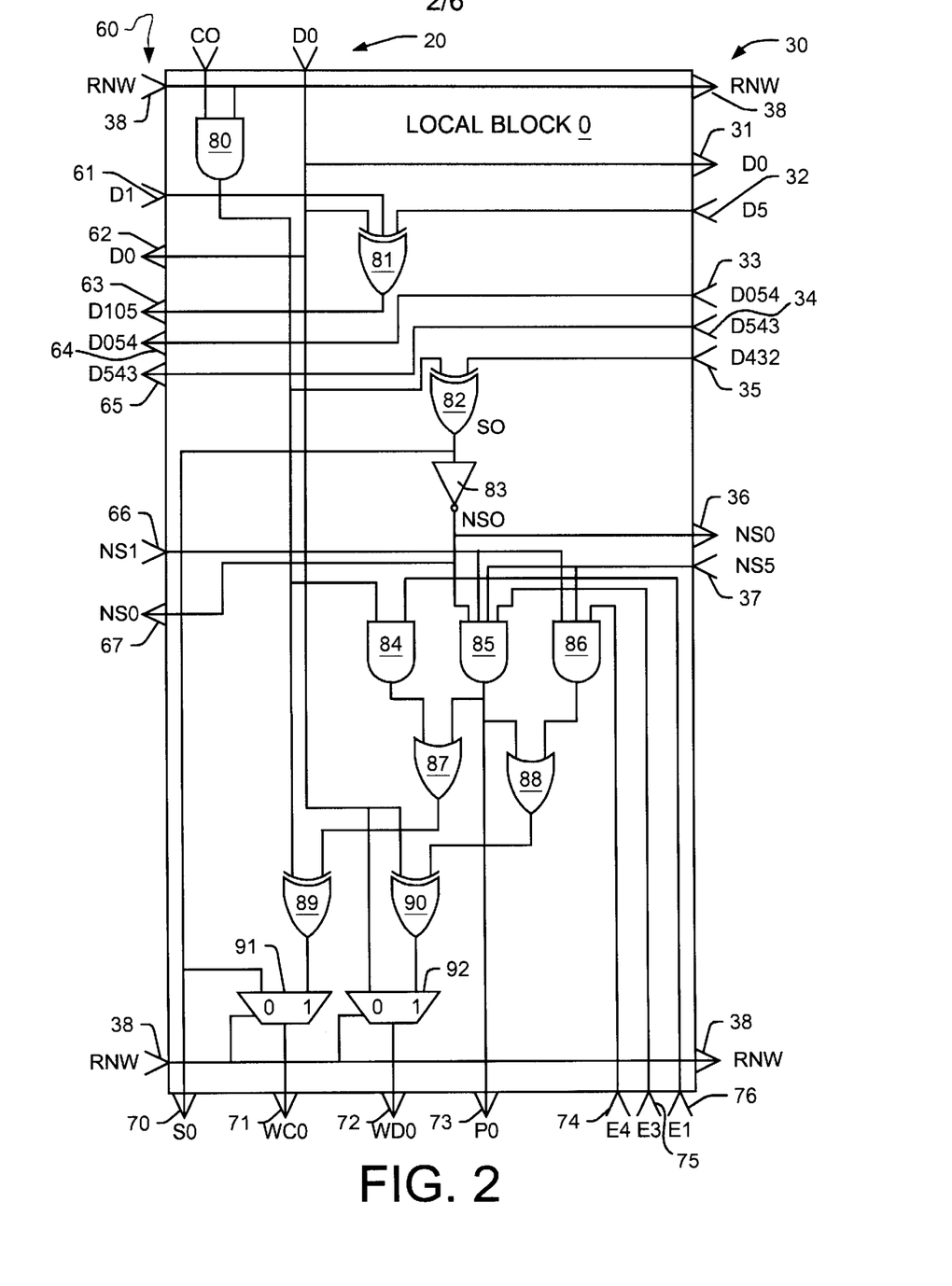
FIG. 2 is an exemplary basic circuit for one of the local blocks in the error correcting code system of FIG. 1.

Referring now to FIG. 2, therein is shown the local block 0 which is typical of the local blocks 0–5 and is exemplary of one of the possible circuits to be used with the Mace Code, and one possible circuit for a 6-bit Mace Code.

The local block 0 has inputs/outputs 60 from/to the adjacent local block 1 which consist of connections 61–67 respectively for D1, D0, D105, D054, D543, NS1, and NS0.

The local block 0 further has inputs/output connections to the global block 14, which are designated as inputs/outputs connections 70–76 respectively for syndrome bit 0 (S0), WC0, WD0, pair error bit 0 (P0), error type (status ) bit 4 (E4), E3, and E1.

The C0 input 20 and RNW input 38 are connected to an AND gate 80. An XOR gate 81 is connected to the D0 input 20, the D1 input 61, and the D5 input 32. An XOR gate 82 is connected to the output of the AND gate 80 and the D432 input 35. The output of the XOR gate 82 is connected to an inverter 83. An AND gate 84 is connected to the output of the AND gate 80 and to the E1 input 76 indicative of the number of syndrome bits, as will later be described. An AND gate 85 is connected to the output of the inverter 83, the NS1 input 66, the NS5 input 37, and the E3 input 75. An AND gate 86 is connected to the NS1 input 66, the NS5 input 37, and the E4 input 74.

The output of the AND gates 84 and 85 are input into an OR gate 87. The output of the AND gates 85 and 86 are input into an OR gate 88. An XOR gate 89 is connected to the output of the AND gate 80 and the output of the OR gate 87. An XOR gate 90 is connected to the code bit input 20 and to the output of the OR gate 88. A multiplexer circuit 91 is connected the output of the XOR gate 82, the XOR gate 89, and the RNW input 38 to output a code bit at WC0 output 71. A multiplexer circuit 92 is connected to the data input bit 20, the XOR gate 90, and the RNW input 38 to output the data bit at WD0 output 72.

Figure 3:
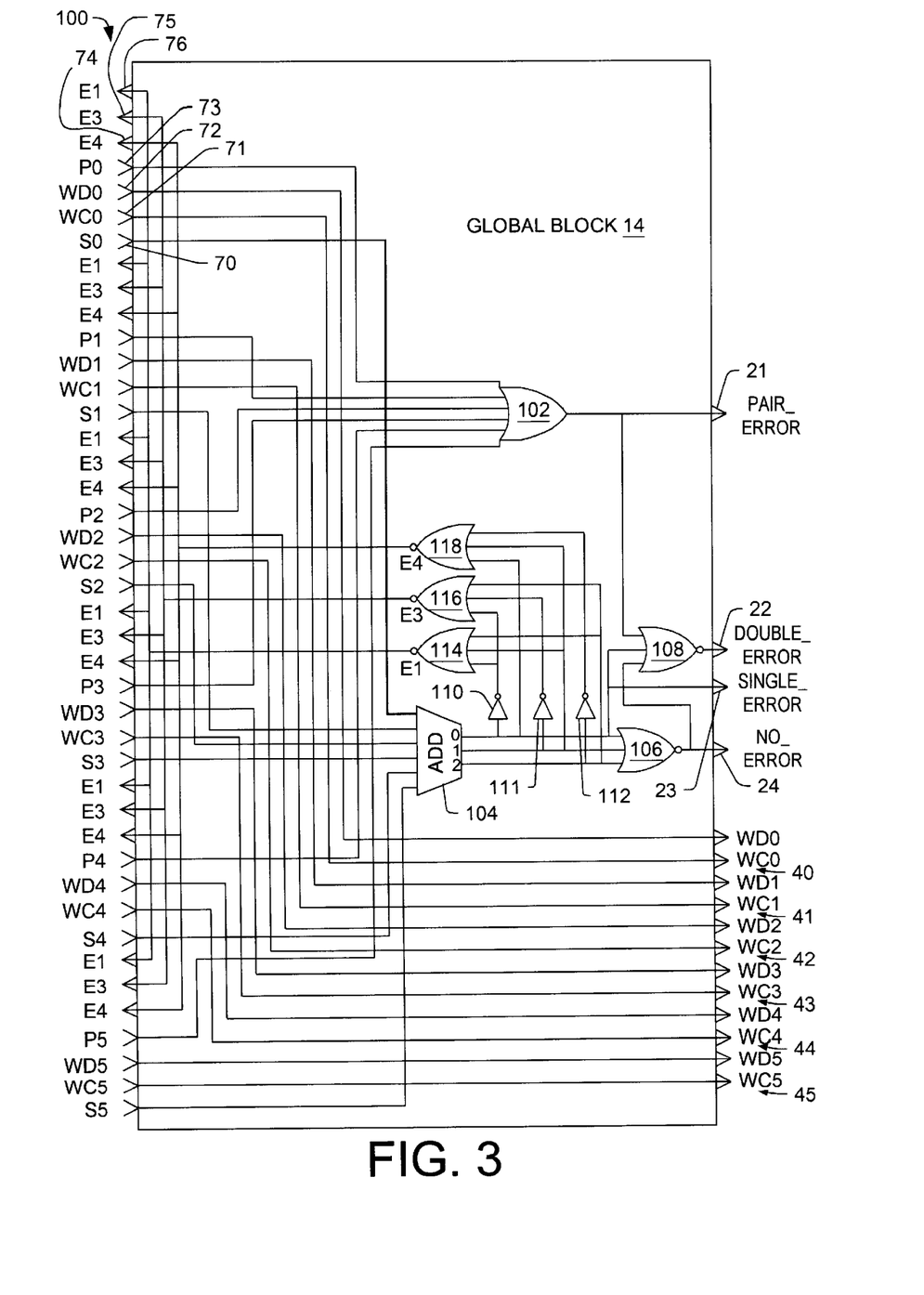
FIG. 3 is an exemplary circuit for a basic global block in the error correcting code system of FIG. 1.

Referring now to FIG. 3, therein is shown the global block 14. The global block 14 has inputs/outputs 100 which consist of the inputs and outputs from the local blocks 0 through 5. The set of inputs/outputs 70–76 from the local block 0 is equivalent to comparable inputs/outputs (shown by bit designation and not number) from blocks 1–5. The global block 14 contains an OR gate 102 which is connected to the P0 input 73 (and also to the comparable P1–P5 inputs which are not numbered) and outputs to the pair error output 21. An adder circuit 104 is connected to the S0 input 70 (and also to the comparable S1–S5 inputs which are not numbered) and outputs to a NOR gate 106. The NOR gate 106 outputs to the "no error" output 24, and to a NOR gate 108, which outputs to the double error output 22. The NOR gate 108 receives inputs from the adder circuit 104 and from the OR gate 102. The three outputs of the adder circuit 104 are also connected to inverters 110, 111, and 112. The output of the inverter 110 is connected to the inputs of NOR gates 114 and 116. The output of the inverter 111 is connected to the input of NOR gate 116. The output of the inverter 112 is connected to the input of the NOR gate 118. The NOR gate 116 further has a direct input from the adder circuit 104 while the NOR gate 114 has a further connection to the two outputs of the adder circuit 104. The NOR gate 118 further has direct inputs from the 0 and 1 outputs of the adder circuit 104.

The NOR gates 114, 116, and 118 respectively output through the E1, E3, and E4 outputs 76, 75, and 74, respectively (and also from the comparable E1, E3, AND E4 outputs, which are not numbered, to local blocks 1–5). The WD0 and WC0 inputs 72 and 71 from local block 0 pass directly through the global block 14 to the outputs 40 and 41, respectively.

Similarly, the WD1–5 inputs from local blocks 1–5 pass through the global block 14 to the pairs of WD1–5 and WC1–5 outputs 41–45. The global block 14 then connects to the subsystem 12, as shown, or another similar element.

Figure 4:
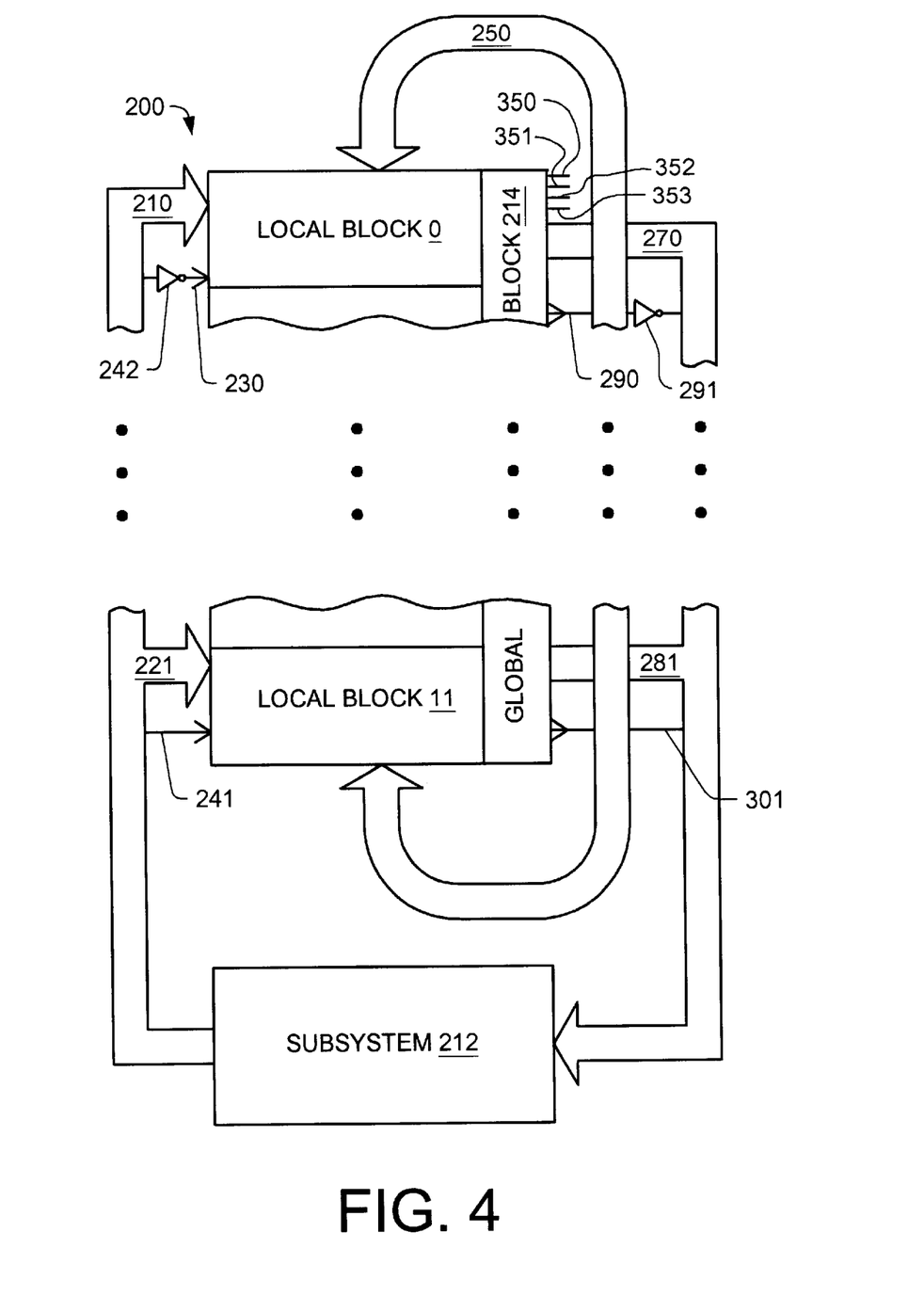
FIG. 4 shows an error correcting code system similar to the error correcting code system of FIG. 1 that error corrects a 12-bit Mace Code.

Referring now to FIG. 4, therein is a shown a cyclic ECC system 200 that uses an 12-bit Mace Code which is output as a bit stream from a subsystem 212 and where the first code is denoted by the hexadecimal notation 001:01c, 023:0bc, 037:92a, 08937f, 0d3:ace, 12b:cbf, 16f:fae, 17d:9a7. The code is organized so there are one hundred and eighty data bits protected by twelve code bits for a total of one hundred and ninety two bits so it is considered a 180+12=192 code.

The 12-bit Mace Code cyclic error correcting circuitry is organized for each of the one hundred and eighty bits as twelve circularly-arranged identical blocks with only the first and last blocks 0 and 11, respectively, being shown. Each local block accepts sixteen bits. For example, the local block 0 accepts fifteen data bits 0, 12, 24, 36, etc. and one code bit 0.

Thus, the blocks 0–11 accept data bits at inputs of which only the first and last inputs 210 and 221, respectively, are shown. The blocks 0–11 accept code bits at inputs of which only the first and last inputs 230 and 241, respectively, are shown. The blocks 0–11 are modifications, which would be obvious to those skilled in the art, of the block shown in FIG. 2.

Inverters may be interposed at a plurality of code bits starting at input 230 with only inverter 242 shown for input 230. Again, this is to avoid problems with bit strings of all zeroes or ones, or a temporary failure of circuitry connected to the subsystem 212.

The local blocks 0–11 are circularly interconnected to each have a plurality of inputs and outputs to and from adjacent blocks. In FIG. 4, the inputs/outputs 250 between local block 0 and 11 are shown. The inputs/outputs 250 consist of connections for a code bit, data bits, intermediate bits (for generation of the syndrome bits), syndrome bits, and "not syndrome" bits, as would be obvious to those skilled in the art. Similar connections (not shown) are among all the blocks 0–11.

The local blocks 0–11 are further connected to a global block 214. The global block 214 outputs the corrected data bits at outputs of which only the first and last outputs 270 and 281 are shown and the code bits at outputs of which only the first and last outputs 290 and 301 are shown back to the subsystem 212. For example, the global block 214 outputs data bits WD0, WD12, WD24, etc. at output 270 and code bit WC0 at output 290. The global block 214 is a modification, which would be obvious to those skilled in the art, of the global block 14 shown in FIG. 3.

Inverters may be respectively interposed at a plurality of code bits starting at output 290 to invert the signal inversions by inverters starting with signal inverter 242. If an inverter is used on an input to a local block, an inverter is used on the corresponding output from the global block. The outputs from the global block 214 are provided to the subsystem 212 or another similar element.

The global block 214 further has status outputs such as a pair error output 350, a double error output 351, a single error output 352, and a no error output 353.

Figure 5:
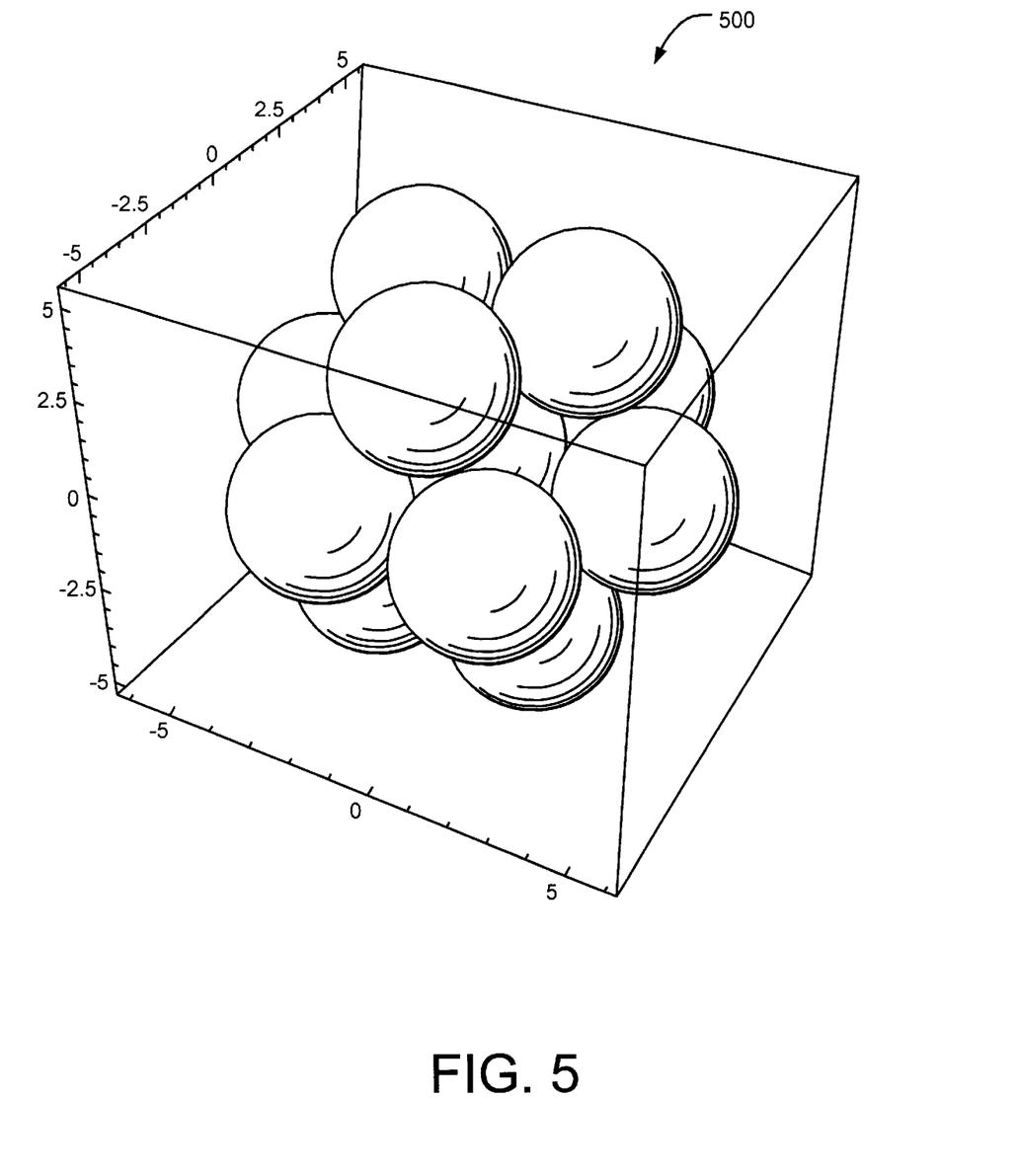
FIG. 5 shows a visual metaphor of hyperspace hyperspheres of a Hamming code.

Referring now to FIG. 5, therein is shown a visual metaphor of hyperspace spheres 500 of a Hamming error correcting code in a higher dimensional space, or hyperspace. It is disclosed strictly as a visualization aid since it is not mathematically accurate. If the code word is at the center of the sphere and the radius of the sphere is a half integer, then no code word is any closer than the diameter, or twice the radius, from any other code word. The code would be designated by the diameter value. For example, distance-4 code would have a radius 2 sphere and no code word is any closer than 4 from any other code word. Thus, a distance-4 code.

Figure 6:
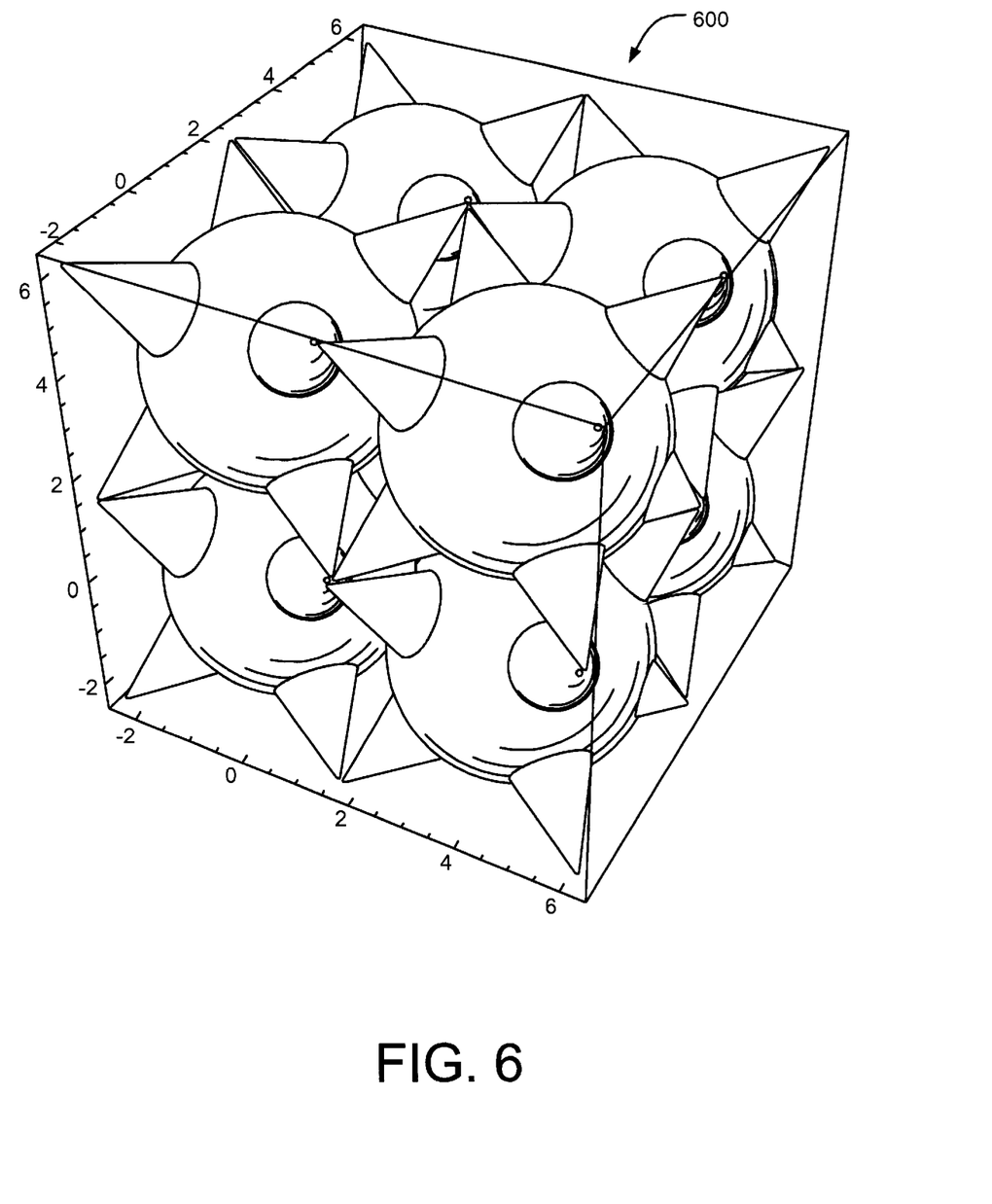
FIG. 6 shows a visual metaphor of hyperspace hypermaces of the Mace Code of the present invention.

Referring now to FIG. 6, therein is shown a visual metaphor of hyperspace maces 600 of a Mace cyclic error correcting code. Again, it is disclosed strictly as a visualization aid since it is not mathematically accurate. The Mace Code can be thought of as a hypersphere of a specific diameter that has "spikes" sticking out of it. In the direction of those spikes, the distance from the tip of the spike to the center of the hypersphere is greater than the radius of the sphere. The three dimensional version looks like the head of a medieval "mace", thus the name "Mace Code". This "hyper-mace" has the property that it is a certain distance code in most directions and a further distance code in the direction of the spikes.

The Mace Code hypersphere of radius 2 has "spikes" sticking out of it. In the direction of those spikes the distance from the tip of the spike to the center of the hypersphere is 3. Thus this "hyper-mace" has the property that it is a distance-4 code in most directions and a distance-6 code in the direction of the spikes. The spikes of each of these Mace Code words are carefully chosen to line up with each of the directions that a double bit error would take if it occurred in an adjacent pair of bits.

Formally, if w[i] and w[j] are two different code words in the Mace Code, then distance(w[i],w[j])$\geq$4 for all i$\neq$j and, if w[i] and w[j] differ in both of an adjacent pair of bits, then distance(w[i],[j])$\geq$6 where distance(w1,w2) is the ordinary Hamming distance.

Since the Mace Code describes corrections that are much more complex than those in an ordinary distance-4 code, the ordinary method of describing such a code by its H and G matrices does not apply. Therefore, the same notation used in the Zuras et al. patent (U.S. Pat. No. 5,539,754), which is incorporated by reference, will be used to specify a Mace Code.

The notation for a Mace Code will consist of a collection of numbers written in hexadecimal. For example, 001:177, 019:0A7, and 027:037describes a Mace Code with respect to a rotation group of 9 elements which protects 45 data bits with 9 code bits (45+9=54) organized as 27 pairs of bits which are correctable in pairs. The numbers, C0:D0, D9:D18, and D27:D36, are arranged in comma separated pairs with a colon in between each member of a pair. Each pair actually stands for 9 pairs generated by rotating the bits of each number by the rotation element of order 9. So, 001:177actually represents all of the matrix elements 001:177, 002:0ef, 004:1de, 008:1bd, 101:17b, 020:0f7, 040:1ee, 080:1dd, and 100:1bb. So, C0:D0, D9:D18, and D27:D36, represents all of the elements C0 through C8 and D0 through D44 where the Ci are code bits and the Di are data bits.

When these elements are arranged into a matrix, they look like the ordinary H and G matrix representation of a distance-4 code. And, to the extent that the Mace Code is subsumptive of a distance-4 code, that matrix would represent the ordinary single bit error detection properties of the code. But it fails to represent the ability of the code to correct double bit errors in adjacent pairs.

For that, it is necessary to construct the Pi from the Ci & Di as P0=C0(+)D0, P9=D9(+)D18, and P18=D27(+)D36 where (+) is the bitwise exclusive OR operation. As before, these Pi actually represent the 27 elements P0 through P26 by rotation. The Pi have no place in an ordinary H or G matrix representation of an error correcting code but they have the property that any Pi is at least 6 away from any other Pj and at least 4 away from any Cj or Dj in the Hamming sense.

This permits the circuitry of FIG. 4 for a 12-bit Mace Code cyclic ECC system 200 to (1) distinguish pair errors from other double bit errors, and (2) correct the pair errors.

In operation, a code word is output from the subsystem 12 and the appropriate data and code bits are input on a read to the inputs 21–25 with the bits possibly being inverted for the code at inputs 20, 22, and 24. The code bit 0 (C0) input 20 is ANDed by AND gate 80 with the RNW input 38 such that a write provides a 0 and a read provides the code bit.

The D0 input 20 is provided to the local block 5, the local block 1, the XOR gate 81, the XOR 90, and the multiplexer circuit 92. The D0 input 20 is XORed with a D1 input 61 from the local block 1 and the D5 input 32 from the local block 5 to provide the D105 output 63 through the local block 1 to the local block 3. The output of the AND gate 80 is XORed with the D432 input 35 from the local block 3 in the XOR gate 82. The XOR gates 81 and 82 help to provide the syndrome bit, S0 output 70. The output of the XOR gate 82 is also provided to the inverter 83 to provide NS0 output 36 to the local block 5 and as the NS0 output 67 to the local block 1. The NS0 output 36 is further ANDed in the AND gate 85 with the NS1 input 66 from the local block 1, the NS5 input 37 from the local block 5, and the E3 input 75 from the global block 14. The output of the AND gate 85 is the P0 output 73 which indicates that there is a pair error which needs to be corrected. The C0 input 20 is ANDed with the RNW input 38 in the AND gate 80 which provides an output which is ANDed with the NS5 input 37 from the local block 5 in the AND gate 84. Also, in the AND gate 86, the NS1 input 66 from the local block 1, the NS5 input 37 from the local block 5, and the E4 input 74 from the global block 14 are ANDed to provide an output to the OR gate 88. The outputs of the AND gates 84 and 85 are ORed in the OR gate 87 and the outputs of the AND gates 85 and 86 are ORed in the OR gate 88. The AND and OR gates 84–88 determine whether or not to correct a local bit or local pair of bits.

The output of the AND gate 80 is XORed with the output of the OR gate 87 in the XOR gate 89, and the D0 input 20 is XORed with the output of the OR gate 88 in the XOR gate 90. The S0 output 70 and the output of the XOR gate 89 are multiplexed in accordance with RNW input 38 to provide the WC0 output 71. The D0 input 20 is multiplexed with the output of the XOR gate 90 in the multiplexer circuit 92 in accordance with the RNW input 38 to provide the WD0 output 72. When a correction is required, the XOR gates 89 and 90 and the multiplexer circuits 91 and 92 make the correction.

Basically, an initial AND gate, such as the AND gate 80, is used to gate off a code bit during a write. The initial XOR gates, such as the XOR gates 81 and 82, and the various data inputs and outputs generate the syndrome for a particular portion of the code and provide the syndrome output, such as S0 output 70. The syndrome inputs and outputs from the various local blocks are then used to generate the correction indicators which indicate if the code bit, the data bit, or the pairs of bits in the local block should be corrected through the AND and OR gates, such as the gates 84–88. The syndrome outputs are ADDed in ADD 104 in the global block 14 and returned as the E1, E3, and E4 inputs to the local blocks, such as the local block 0.

The XOR gates and multiplexer circuits take the input data and XOR it with the correction indicator and change the input data bit when a correction needs to be made. In local block 0, these elements are XOR gates 89 and 90 and the multiplexer circuits 91 and 92. The multiplexer circuits 91 and 92 then provide the corrected data and code bits at the outputs, such as WD0 and WC0 outputs 72 and 71, in accordance with RNW input 38.

In FIG. 3, the corresponding inputs and outputs for a single local block are inputted and outputted to and from the global block 14 of FIG. 3. The adder circuit 104 adds up the six syndrome bits from each of the local blocks 0–5 and outputs them as a binary number on the outputs 0, 1, and 2 of the adder circuit 104. The binary number is provided to the gates 106 and 108 to determine whether or not either no error or a double-bit error has occurred by examining the syndrome bits. Then, a decoding is done of the sum of the syndrome bits through inverters 110–112 and NOR gates 114, 116, and 118 which produce the E1, E3, and E4 outputs 74–76, respectively. The E1 output 76 indicates that the total number of syndrome bits on the sum was 1, E3 output 75 indicates that it was 3, and the E4 output 74 indicates that it was 4.

The OR gate 102 OR's all the indications of an error in the pair of bits in each of the local blocks such that if any local block corrected a pair of bits, this is reported at the pair error output 21.

Essentially, in a write, the data bits are provided but not the code bits. The code bits are set at zero and the bits are processed to produce the syndrome bit so the data bits and syndrome bit together form the correct code. The correct code is then processed and the syndrome bit is put out as the code bit which protects the data bits. The correct code is then transmitted to a subsystem for storage.

Essentially, in a read, the correct code with the data and code bits is re-transmitted back and processed. The data bits indicate the syndrome or what the code should be. The code bits indicate what the code is. When the syndrome and the code bits are XORed, a result of zero indicates there is no error. If the result is not zero, the number of bits that are different is related to the error, where the error is, and how to correct it.

The number of bits set will always be odd if a single bit is in error. If a double bit is in error, the number of code bits will be even, 2 or 4 or 6 or a larger even number, but it will be non-zero and at least 2. And in the case of the Mace Code, if the error is in an adjacent pair of bits, the ECC system 10 will be able to detect this and the Mace Code will assert a Pi bit indicating the occurrence of a correctable pair error and correct both of the bits.

The 6-bit Mace Code is unique (up to a permutation of the bits) and is denoted by 01:1c and the code words are 6+6=12 bits long.

There are 20 7-bit Mace Codes possible (up to a permutation of the bits) and they are denoted by 01:1c; 01:38; 01:16; 01:3c; 01:58; 01:62; 01:1a; 01:34; 01:68; 01:46; 01:26; 01:64; 01:52; 01:4a; 01:73; 01:4f; 01:2f; 01:75; 01:5d; and 01:3b. The 7-bit Mace Code words are 7+7=14 bits long.

There are 8 8-bit Mace Codes possible (up to a permutation of the bits) and they are denoted by 01:16, 19:d6; 01:58, 13:7c; 01:34, 19:c7; 01:d0, 13:6d; 01:bc, 07:32; 01:f2, 13:29; 01:7a, 07:62; and 01:9e, 19:92. The 8-bit Mace Code words are 24+8=32 bits long.

There are 12 9-bit Mace Codes possible (up to a permutation of the bits) and they are denoted by 001:07c, 00d:098, 02f:076; 001:0f8, 00b:121, 037:07a; 001:0ce, 019:025, 037:0e5; 001:1cc, 013:114, 03b:1a9; 001:1e7, 00b:1b1, 013:147; 001:19f, 00d:1b8, 019:0bc; 001:15a, 00b:112, 03d:0ae; 001:16a, 00d:114, 02f:09d; 001:0bf, 00b:13a, 029:11e; 001:1f5, 00d:195, 025:05e; 001:1bb, 013:15c, 025:03b; and 001:177, 019:0a7, 027:037. The 9-bit Mace Codes are 45+9=54 codes.

There are 217,423 10-bit Mace Codes possible. The first is denoted by 001:01c, 023:0bc, 029:271; etc. The 10-bit Mace Codes are 50+10=60 codes.

The first 11-bit Mace Code is denoted by 001:01c, 023:178, 04f:4fc, 06b:579, 0df:2f5. The 11-bit Mace Codes are 99+11=110 codes.

The first 12-bit Mace Code is denoted by 00:01c, 023:0bc, 037:92a, 08:37f, 0d3:ace, 12b:cbf, 16f:fae, 17d:9a7. The 12-bit Mace Codes are 180+12=192 codes.

The first 13-bit Mace Code is denoted by 0001:001c, 0023:0148, 002f:0062, 0061:019c, 0097:0379, 0193:196c, 02bb:1732, 03e5:0976, 04eb:09df, 052f:1955. The 13-bit Mace Codes are 247+13=260 codes.

The first 14-bit Mace Code is denoted by 0001:001c, 0023:0148, 002f:0062, 0061:019c, 0097:014e, 0111:2be0, 0255:04be, 0313:12ec, 0323:3b5c, 032f:0979, 03ab:3534, 0519:3a75. The 14-bit Mace Codes are 322+14=336 codes.

In summary, the present invention can protect a large number of data bits against both single and pair errors using only a limited number of code bits as shown below.

| Code Bits | Mace Code Data Bits Protected |
|---|---|
| 6 | 6 |
| 7 | 7 |
| 8 | 24 |
| 9 | 45 |
| 10 | 50 |
| 11 | 99 |
| 12 | 180 |
| 13 | 247 |
| 14 | 322 |

Further, the ordering of bits is irrelevant as indicated by the parenthetical that so many Mace Codes are possible "up to a permutation of the bits". The Mace Code is looking for a particular set of arrangements of bits and it uses all possible cyclic arrangements of bits. So, although it might be possible to describe another code which looks different because the bits have been rearranged or permuted, it can be shown to be really the same code by a permutation of the bits.

Still further, all Mace Codes have the property that, if the code is permuted by a cyclic permutation, the same code results.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. An error correcting code system comprising:
    a subsystem operating with a predetermined plurality of code bits and data bits in a plurality of code words;
    single bit error circuitry operatively connected to said subsystem for detecting and correcting single bit errors in portions of said plurality of code words;
    double bit error circuitry operatively connected to said subsystem for detecting double bit errors and for correcting predetermined double bit errors in said portions of said plurality of code words; and
    said plurality of code words is capable of being permuted by a cyclic permutation to provide said plurality of code words whereby a cyclic single error detecting, double error correcting, pair error correcting code is provided.

2. The error correcting code system as claimed in claim 1 including:
    six blocks each having said single bit error circuitry and said double bit error circuitry;
    said six blocks circularly interconnected; and
    said six blocks using six code bits to protect at most six data bits.

3. The error correcting code system as claimed in claim 1 including:
    seven blocks each having said single bit error circuitry and said double bit error circuitry;
    said seven blocks circularly interconnected; and
    said seven blocks using seven code bits to protect at most seven data bits.

4. The error correcting code system as claimed in claim 1 including:
    eight blocks each having said single bit error circuitry and said double bit error circuitry;
    said eight blocks circularly interconnected; and
    said eight blocks using eight code bits to protect at most twenty-four data bits.

5. The error correcting code system as claimed in claim 1 including:
    nine blocks each having said single bit error circuitry and said double bit error circuitry;
    said nine blocks circularly interconnected; and
    said nine blocks using nine code bits to protect at most forty-five data bits.

6. The error correcting code system as claimed in claim 1 including:
    ten blocks each having said single bit error circuitry and said double bit error circuitry;
    said ten blocks circularly interconnected; and
    said ten blocks using ten code bits to protect at most fifty data bits.

7. The error correcting code system as claimed in claim 1 including:
    eleven blocks each having said single bit error circuitry and said double bit error circuitry;
    said eleven blocks circularly interconnected; and
    said eleven blocks using eleven code bits to protect at most ninety-nine data bits.

8. The error correcting code system as claimed in claim 1 including:
    twelve blocks each having said single bit error circuitry and said double bit error circuitry;
    said twelve blocks circularly interconnected; and
    said twelve blocks using twelve code bits to protect at most one hundred eighty data bits.

9. The error correcting code system as claimed in claim 1 including:
    thirteen blocks each having said single bit error circuitry and said double bit error circuitry;
    said thirteen blocks circularly interconnected; and
    said thirteen blocks using thirteen code bits to protect at most two hundred forty seven data bits.

10. The error correcting code system as claimed in claim 1 including:
    fourteen blocks each having said single bit error circuitry and said double bit error circuitry;
    said fourteen blocks circularly interconnected; and
    said fourteen blocks using fourteen code bits to protect at most three hundred twenty two data bits.

11. An error correcting code system comprising:
    a subsystem for sending and receiving data and code bits in a plurality of code words;
    single bit error circuitry operatively connected to said subsystem for detecting and correcting single bit errors in portions of said plurality of code words;

double bit error circuitry operatively connected to said subsystem for detecting double bit errors and for correcting only predetermined double bit errors in said portions of said plurality of code words; and said plurality of code words capable of being permuted by a cyclic permutation to provide said plurality of code words whereby a cyclic single error detecting, double error correcting, pair error correcting code is provided.

12. The error correcting code system as claimed in claim 11 including:

six blocks each having said single bit error circuitry and said double bit error circuitry;

said six blocks circularly interconnected;

said six blocks using six code bits to protect at most six data bits where the first code is denoted by 01:1c; and a global block connected to said six blocks for outputting said code word to said subsystem with the errors corrected.

13. The error correcting code system as claimed in claim 11 including:

seven blocks each having said single bit error circuitry and said double bit error circuitry;

said seven blocks circularly interconnected;

said seven blocks using seven code bits to protect at most seven data bits where the first code is denoted by 01:1c; and a global block connected to said seven blocks for outputting said code word to said subsystem with the errors corrected.

14. The error correcting code system as claimed in claim 11 including:

eight blocks each having said single bit error circuitry and said double bit error circuitry;

said eight blocks circularly interconnected;

said eight blocks using eight code bits to protect at most twenty-four data bits where the first code is denoted by 01:16,19:d6; and a global block connected to said eight blocks for outputting said code word to said subsystem with the errors corrected.

15. The error correcting code system as claimed in claim 11 including:

nine blocks each having said single bit error circuitry and said double bit error circuitry;

said nine blocks circularly interconnected;

said nine blocks using nine code bits to protect at most forty-five data bits where the first code is denoted by 001:07c, 00d:098, 02f:076; and a global block connected to said nine blocks for outputting said code word to said subsystem with the errors corrected.

16. The error correcting code system as claimed in claim 11 including:

ten blocks each having said single bit error circuitry and said double bit error circuitry;

said ten blocks circularly interconnected;

said ten blocks using ten code bits to protect at most fifty data bits where the first code is denoted by 001:01c, 023:0bc, 029:271; and a global block connected to said ten blocks for outputting said code word to said subsystem with the errors corrected.

17. The error correcting code system as claimed in claim 11 including:

eleven blocks each having said single bit error circuitry and said double bit error circuitry;

said eleven blocks circularly interconnected;

said eleven blocks using eleven code bits to protect at most ninety-nine data bits where the first code is denoted by 001:01c, 023:178, 04f:4fc, 06b:579, 0df:2f5; and a global block connected to said eleven blocks for outputting said code word to said subsystem with the errors corrected.

18. The error correcting code system as claimed in claim 11 including:

twelve blocks each having said single bit error circuitry and said double bit error circuitry;

said twelve blocks circularly interconnected;

said twelve blocks using twelve code bits to protect at most one hundred eighty data bits where the first code is denoted by 001:01c, 023:0bc, 037:92a, 08937f, 0d3:ace, 12b:cbf, 16f:fae, 17d:9a7; and a global block connected to said twelve blocks for outputting said code word to said subsystem with the errors corrected.

19. The error correcting code system as claimed in claim 11 including:

thirteen blocks each having said single bit error circuitry and said double bit error circuitry;

said thirteen blocks circularly interconnected;

said thirteen blocks using thirteen code bits to protect at most two hundred forty seven data bits where the first code is denoted by 0001:001c, 0023:0148, 002f:0062, 0061:019c, 0097:0379, 0193:196c, 02bb:1732, 03e5:0976, 04eb:09df, 052f:1955; and a global block connected to said thirteen blocks for outputting said code word to said subsystem with the errors corrected.

20. The error correcting code system as claimed in claim 11 including:

fourteen blocks each having said single bit error circuitry and said double bit error circuitry;

said fourteen blocks circularly interconnected;

said fourteen blocks using fourteen code bits to protect at most three hundred twenty two data bits where the first code is denoted by 0001:001c, 0023:0148, 002f:0062, 0061:019c, 0097:014c, 0111:2be0, 0255:04be, 0313:12ec, 0323:3b5c, 032f:0979, 03ab:3534, 0519:3a75; and a global block connected to said fourteen blocks for outputting said code word to said subsystem with the errors corrected.

* * * * *